(12) United States Patent
Gurin (10) Patent No.: US 11,230,470 B2
(45) Date of Patent: Jan. 25, 2022

(54) SEMICONDUCTOR DEVICE WITH PATTERNED CONTACT AREA

(71) Applicant: INVENSENSE, INC., San Jose, CA (US)

(72) Inventor: Ilya Gurin, Mountain View, CA (US)

(73) Assignee: INVENSENSE, INC., San Jose, CA (US)

( * ) Notice: Subject to any disclaimer, the term of this patent is extended or adjusted under 35 U.S.C. 154(b) by 162 days.

(21) Appl. No.: 15/694,301

(22) Filed: Sep. 1, 2017

(65) Prior Publication Data

US 2019/0071308 A1 Mar. 7, 2019

(51) Int. Cl.
*B81C 1/00* (2006.01)
*B81B 3/00* (2006.01)

(52) U.S. Cl.
CPC ........ *B81C 1/00952* (2013.01); *B81B 3/0051* (2013.01); *B81C 1/00928* (2013.01)

(58) Field of Classification Search
CPC .......... B81C 1/00952; B81C 1/00912–00992; B81C 1/0092; B81C 1/00928; B81B 3/0051
See application file for complete search history.

(56) References Cited

U.S. PATENT DOCUMENTS

| | | | | |
|---|---|---|---|---|
| 2016/0318753 A1* | 11/2016 | Chou | ...................... | B81B 3/001 |
| 2017/0283250 A1* | 10/2017 | Liu | ........................ | B81B 3/0051 |
| 2019/0062153 A1* | 2/2019 | Tseng | ..................... | B81B 3/001 |

\* cited by examiner

*Primary Examiner* — Hoang-Quan Ho
(74) *Attorney, Agent, or Firm* — Amin, Turocy & Watson, LLP (57) ABSTRACT

The present invention relates to semiconductor devices, such as microelectromechanical (MEMS) devices, with improved resilience during manufacturing. In one embodiment, a MEMS device includes a MEMS structure; a substrate situated parallel to the MEMS structure and positioned a first distance from the MEMS structure; and a bump stop structure formed on the substrate between the substrate and the MEMS structure, wherein the bump stop structure substantially traces a perimeter of the substrate, wherein the bump stop structure extends from the substrate to a second distance from the MEMS structure, and wherein the second distance is greater than zero and less than the first distance.

15 Claims, 7 Drawing Sheets

FIG. 1

(Prior Art)

SEMICONDUCTOR DEVICE WITH PATTERNED CONTACT AREA

BACKGROUND

Micromechanical devices, such as microelectromechanical (MEMS) devices, can be vulnerable to capillary pull-in and stiction during manufacturing. For instance, during wet cleaning steps of a manufacturing process, suspended structures can be surrounded by a liquid such as water. When the liquid begins to dry, a meniscus can form on the edge of the structure, exerting a surface tension force that can pull the structure into the substrate. If this pull-in occurs, molecular forces (e.g., van der Waals forces) can prevent the structure from releasing again when the liquid fully dries.

SUMMARY

The following presents a simplified summary of one or more of the embodiments of the present invention in order to provide a basic understanding the embodiments. This summary is not an extensive overview of the embodiments described herein. It is intended to neither identify key or critical elements of the embodiments nor delineate any scope of embodiments or the claims. This Summary's sole purpose is to present some concepts of the embodiments in a simplified form as a prelude to the more detailed description that is presented later. It will also be appreciated that the detailed description may include additional or alternative embodiments beyond those described in the Summary section.

The present disclosure recognizes and addresses, in at least certain embodiments, the issue of capillary pull-in force during manufacturing of a micromechanical device. A device as produced according to one or more embodiments discussed herein includes one or more recesses connected to the outside ambient by one or more channels. At the outset of the drying phase of the manufacturing process, a meniscus forms on the outermost surface of the structure. As the volume of liquid trapped under the structure decreases (e.g., through evaporation), the meniscus can be drawn through the channels, along a specifically chosen path, to progressively empty the recesses without pulling the structure down. Various embodiments discussed herein provide ways of designing the structure so that the meniscus follows the chosen path.

Additionally, the present disclosure recognizes and addresses, in at least certain embodiments, the issue of providing increased cavity pressure for a micromechanical device such as an accelerometer. Micromechanical devices are conventionally packaged in a vacuum. However, it is desirable for an accelerometer to operate in a critically damped condition. This damping can be achieved in a vacuum-packaged process by including a material in the cavity that outgasses after sealing. Various embodiments discussed herein provide a device structure with reduced cavity volume, which can be beneficial to achieve improved cavity pressure with a limited amount of gas.

In one aspect disclosed herein, a microelectromechanical system (MEMS) device includes a MEMS structure, a substrate situated parallel to the MEMS structure and positioned a first distance from the MEMS structure, and a bump stop structure formed on the substrate between the substrate and the MEMS structure. The bump stop structure substantially traces a perimeter of the substrate and extends from the substrate to a second distance from the MEMS structure. The second distance is greater than zero and less than the first distance.

In another aspect disclosed herein, a MEMS device includes a MEMS structure that includes one or more MEMS features, a substrate situated parallel to the MEMS structure and positioned a first distance from the MEMS structure, and a bump stop structure formed on the substrate between the substrate and the MEMS structure. The bump stop structure substantially traces an area of the substrate adjacent to respective ones of the one or more MEMS features of the MEMS structure and extends from the substrate to a second distance from the MEMS structure. The second distance is greater than zero and less than the first distance.

In still another aspect disclosed herein, a MEMS device includes a MEMS structure, a substrate situated parallel to the MEMS structure and positioned a first distance from the MEMS structure, and a recess formed in the substrate. The recess is constrained by a boundary region disposed along a perimeter of the substrate and extends into the substrate to a second distance from the MEMS structure. The first distance is greater than zero and less than the second distance.

Other embodiments and various examples, scenarios and implementations are described in more detail below. The following description and the drawings set forth certain illustrative embodiments of the specification. These embodiments are indicative, however, of but a few of the various ways in which the principles of the specification may be employed. Other advantages and novel features of the embodiments described will become apparent from the following detailed description of the specification when considered in conjunction with the drawings.

DETAILED DESCRIPTION

The present disclosure recognizes and addresses, in at least certain embodiments, the issue of capillary pull-in force during manufacturing of a micromechanical device. A device as produced according to one or more embodiments discussed herein includes one or more recesses connected to the outside ambient by one or more channels. At the outset of the drying phase of the manufacturing process, a meniscus forms on the outermost surface of the structure. As the volume of liquid trapped under the structure decreases (e.g., through evaporation), the meniscus can be drawn through the channels, along a specifically chosen path, to progressively empty the recesses without pulling the structure down.

Additionally, the present disclosure recognizes and addresses, in at least certain embodiments, the issue of providing increased cavity pressure for a micromechanical device such as an accelerometer. Micromechanical devices are conventionally packaged in a vacuum. However, it is desirable for an accelerometer to operate in a critically damped condition. This damping can be achieved in a vacuum-packaged process by including a material in the cavity that outgasses after sealing. Various embodiments discussed herein provide a device structure with reduced cavity volume, which can be beneficial to achieve improved cavity pressure with a limited amount of gas.

Figure 1:
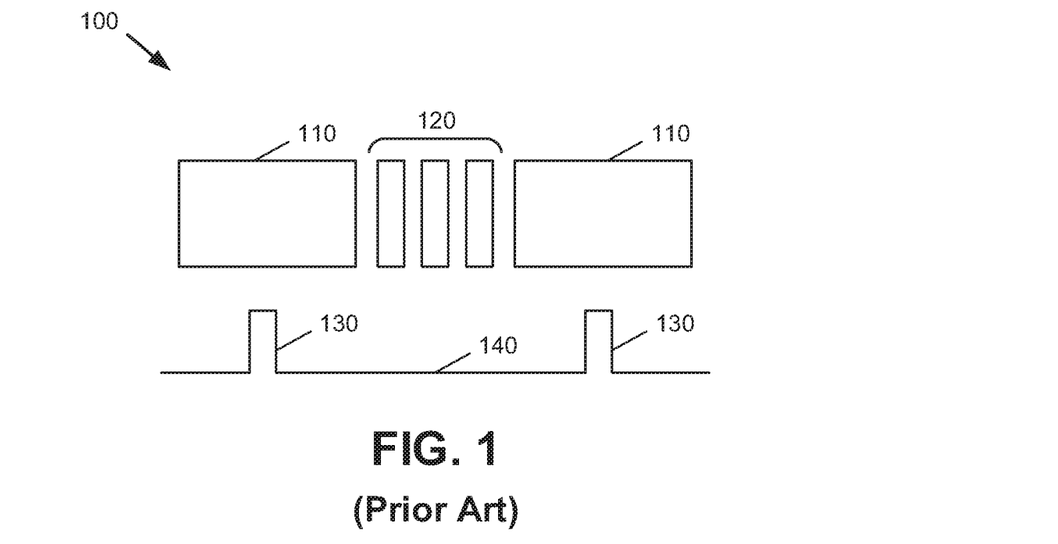
FIGS. 1-2 are cross-sectional views of respective semiconductor device structures in accordance with one or more embodiments of the disclosure.

With reference to the drawings, FIG. 1 depicts a cross-sectional view of a MEMS device 100, e.g., an accelerometer, a gyroscope, and/or any other suitable device utilizing MEMS elements, according to the prior art. The device 100 includes a MEMS structure, which is composed of one or more moveable and comparatively robust MEMS elements 110 and one or more non-moveable or comparatively fragile MEMS elements 120. The device 100 further includes a substrate that includes one or more bump stops 130, the bump stops 130 in turn defining respective recesses 140 formed in the substrate.

The bump stops 130 are utilized in the device 100 in order to reduce the distance traveled by the MEMS elements 110, 120 in cases of shock (e.g., due to the device being dropped and/or other similar exaggerated motion or sudden acceleration), thereby preventing physical damage to the device. Here, the bump stops 130 are positioned in an interior of the MEMS elements 110, so that in no case do they contact the MEMS elements 120, and with a small gap to the MEMS elements 110. The bump stops 130 further occupy a relatively small area compared to the overall area of the substrate. The remainder of the device is composed of the recesses 140, which have a larger gap to the MEMS elements 110, 120.

In an aspect, the bump stops 130 are further positioned to avoid contact between the MEMS elements 110 and the bump stops 130 during normal operation of the device 100 (i.e., outside of a shock condition). As shown by FIG. 1, the bump stops 130 of device 100 are of a relatively small size as compared to that of the recesses 140 formed in the substrate. As a result, the device 100 is associated with a relatively large cavity volume.

Figure 2:
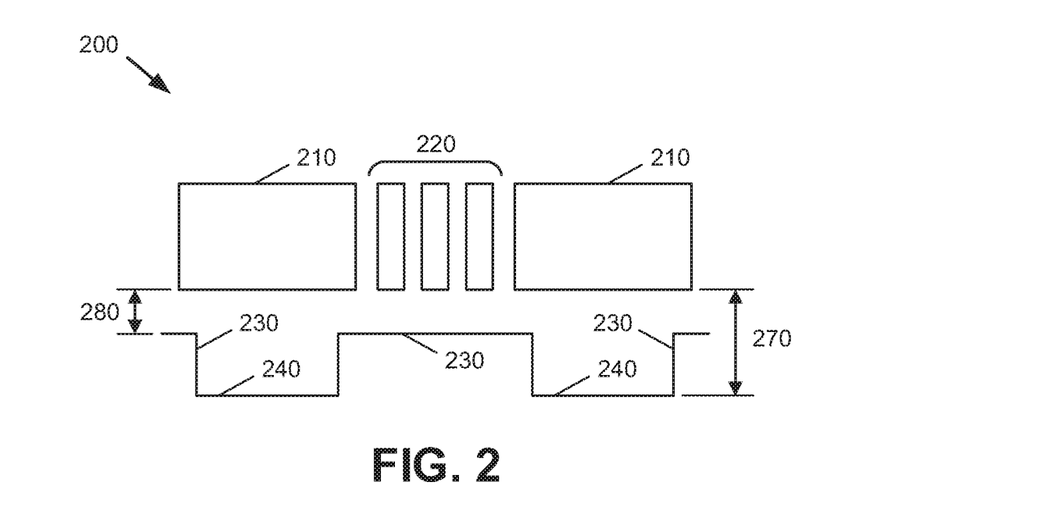

In contrast, FIG. 2 illustrates a MEMS device 200 according to several aspects of the present invention. In FIG. 2, bump stops 230 are disposed along the perimeter of the substrate and recesses 240 are disposed in the interior. As further shown by FIG. 2, one or more bump stops 230 of the device 200 can additionally be positioned in an interior of the structure, e.g., to substantially cover an area associated with one or more non-moveable or comparatively fragile MEMS elements 220. Accordingly, unlike the bump stops 130, the bump stops 230 do contact the comparatively fragile MEMS elements 220 in cases of shock.

In comparison to the bump stops 130 of device 100, the bump stops 230 of device 200 occupy a larger area of the substrate. Accordingly, by configuring the bump stops 230 as shown in FIG. 2, the cavity volume associated with the device 200 can be smaller as compared to corresponding cavity volumes of other MEMS devices. This, in turn, can improve the performance of the device as generally described above.

In an aspect, the MEMS device 200 includes a MEMS structure (e.g., composed of one or more non-moveable MEMS elements 220 and one or more moveable MEMS elements 210) and a substrate that is situated parallel to the MEMS structure and positioned a first distance 270 from the MEMS structure. The non-moveable MEMS elements 220 can include folded springs and/or other suitable non-movable structures. The device 200 further includes a bump stop structure (e.g., composed of one or more bump stops 230 separated by recesses 240) formed on the substrate between the substrate and the MEMS structure.

In an aspect, the bump stop structure can substantially trace a perimeter of the substrate, e.g., as shown by the leftmost and rightmost bump stops 230 of device 200. Also or alternatively, in order to further minimize cavity volume, provide additional physical support for the device 200, and/or other purposes, the bump stop structure can trace other features and/or contours of the device 200, such as the non-moveable MEMS elements 220 in the interior of the device. The bump stop structure can also substantially encompass an area of the substrate corresponding to area(s) in which MEMS features are situated in any other suitable manner(s).

In another aspect, the bump stop structure of device 200 can extend from the substrate to a second distance 280 from the MEMS structure that is less than the first distance 270. In order to prevent contact between the bump stop structure and the MEMS structure during normal operation (e.g., outside of cases of shock or exaggerated motion), the bump stop structure and the MEMS structure can be physically separated, e.g., such that the second distance 280 is greater than zero.

As noted above, FIG. 2 is a cross-sectional view of a MEMS device 200 that can operate according to one or more embodiments described herein. The cross-section illustrated in FIG. 2 can be translated to a three-dimensional object in a variety of ways. For instance, a MEMS device could be substantially circular, and in such a case the cross sections illustrated by FIG. 2 can be, e.g., through a diameter of the device. Other configurations are also possible. Additional configurations that can be utilized are shown and described in more detail below. Further, the moveable MEMS elements 210 shown in FIG. 2 can be configured to move in any suitable manner in three-dimensional space, e.g., within the plane defined by the respective cross sections and/or orthogonal to the plane (e.g., into or out of the page depicting the cross section).

Figure 3:
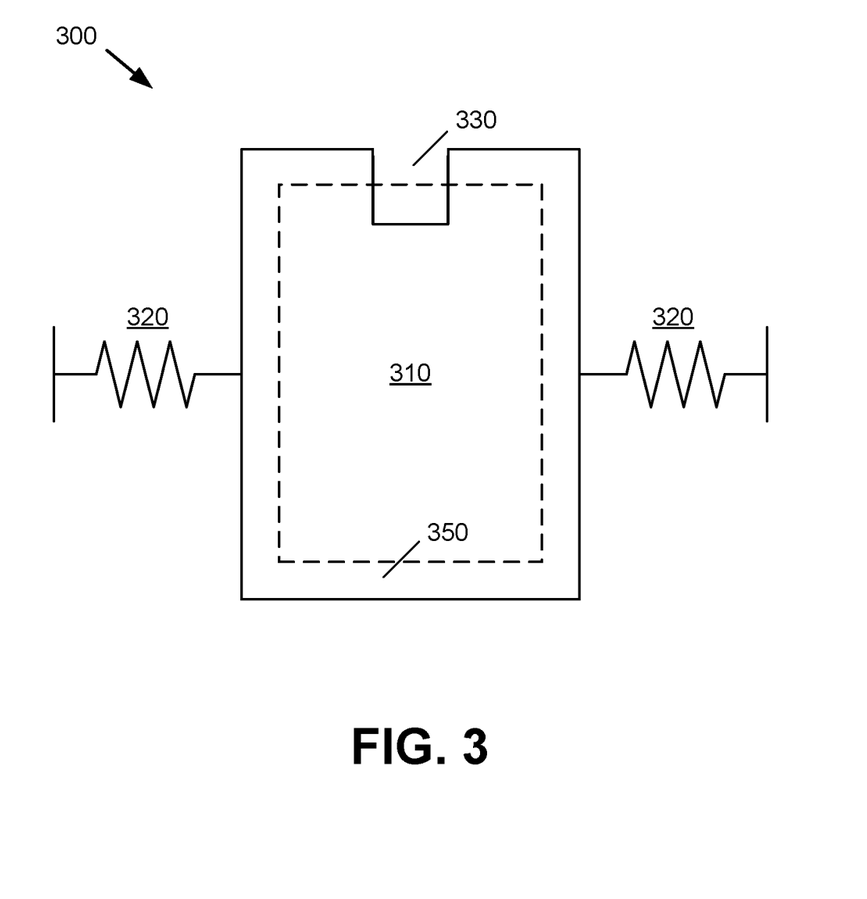
FIG. 3 is a simplified top-down view of a semiconductor device structure in accordance with one or more embodiments of the disclosure.

Referring next to FIG. 3, illustrated is a MEMS device 300 supported by springs 320 and/or other suitable supporting structures. As shown by FIG. 3, the device 300 has a bump stop structure 350 that substantially traces a perimeter of the device 300. The bump stop structure 350, in turn, defines a recess 310 disposed underneath the interior of the device 300, e.g., corresponding to the recesses 240 of device 200.

In an aspect, the bump stop structure 350 associated with the device 300 is a single, continuous structure that substantially traces the perimeter of the device 300. As a result, water and/or other fluids introduced into the device 300 during the manufacturing process can be channeled through the device 300 with improved efficiency, thereby reducing the occurrence and effects of capillary stiction as noted above. Also or alternatively, the device 300 could in some cases have additional bump stop structures not shown in FIG. 3. For instance, a bump stop such as the middle bump stop 230 shown in FIG. 2 could be used to cover an area associated with one or more moveable MEMS features on the interior of the device 300, such as the moveable MEMS elements 210 shown in FIG. 2. Other configurations could also be used.

In addition, the device 300 includes a notch or lateral opening 330 that is cut and/or otherwise situated into a portion of the device 300, here an edge of the device 300, within an area corresponding with the recess 310 (e.g., such that the opening 330 overlaps with the recess 310). The opening 330 can be utilized during one or more steps of the manufacturing process, e.g., during a cleaning step, to introduce water, alcohol, and/or other liquid cleaning agent(s) into the interior of the device. Subsequently, the opening 330 improves the flow of air or other gases into the device, thereby aiding in the evaporation of liquid inserted into the device 300.

As shown by FIG. 3, at least a portion of the opening 330 comprises an area associated with the device 300 that is not occupied by either MEMS features of the device 300 or the bump stop structure 350. While not shown in FIG. 3, at least a portion of the bump stop structure 350 at the position of the opening 330 could also or alternatively be removed in some embodiments.

By configuring the bump stop structure 350 as shown in FIG. 3 and described above, liquid utilized in the manufacturing of the device 300 can evaporate along predetermined channels that reduce capillary stiction and pull-in force while also reducing device cavity volume. Specific examples of ways in which this is achieved are described in further detail below.

In an aspect, the size of the opening 330 can vary based on the characteristics of the device 300, the liquid(s) utilized in manufacturing of the device 300, and/or other factors. In one example, the opening 330 can be formed such that a width and/or length of the opening 330 are no less than (e.g., greater than or equal to) the distance between the distance between the bump stop structure 350 and the MEMS structure of the device 300, e.g., the distance 280 shown in FIG. 2. Alternatively, the opening 330 can be formed such that a width and/or length of the opening 330 are no less than the distance between the distance between the recess 310 and the MEMS structure of the device 300, e.g., the distance 270 shown in FIG. 2. Other configurations are also possible.

While device 300 is described above in terms of a bump stop structure formed onto the device substrate that defines one or more recesses in the substrate, the device 300 could also be constructed and/or conceptualized in the reverse manner, e.g., as one or more recesses formed into the substrate that define a bump stop structure. For instance, a MEMS device manufactured in this manner can include a MEMS structure and a substrate situated parallel to the MEMS structure and positioned a first distance (e.g., the distance 280 shown in FIG. 2) from the MEMS structure, the first distance being greater than zero. A recess can be formed in the substrate that is constrained by a boundary region disposed along the perimeter of the substrate. The recess can extend into the substrate to a second distance (e.g., the distance 270 shown in FIG. 2) from the MEMS structure that is greater than the first distance.

Figure 4:
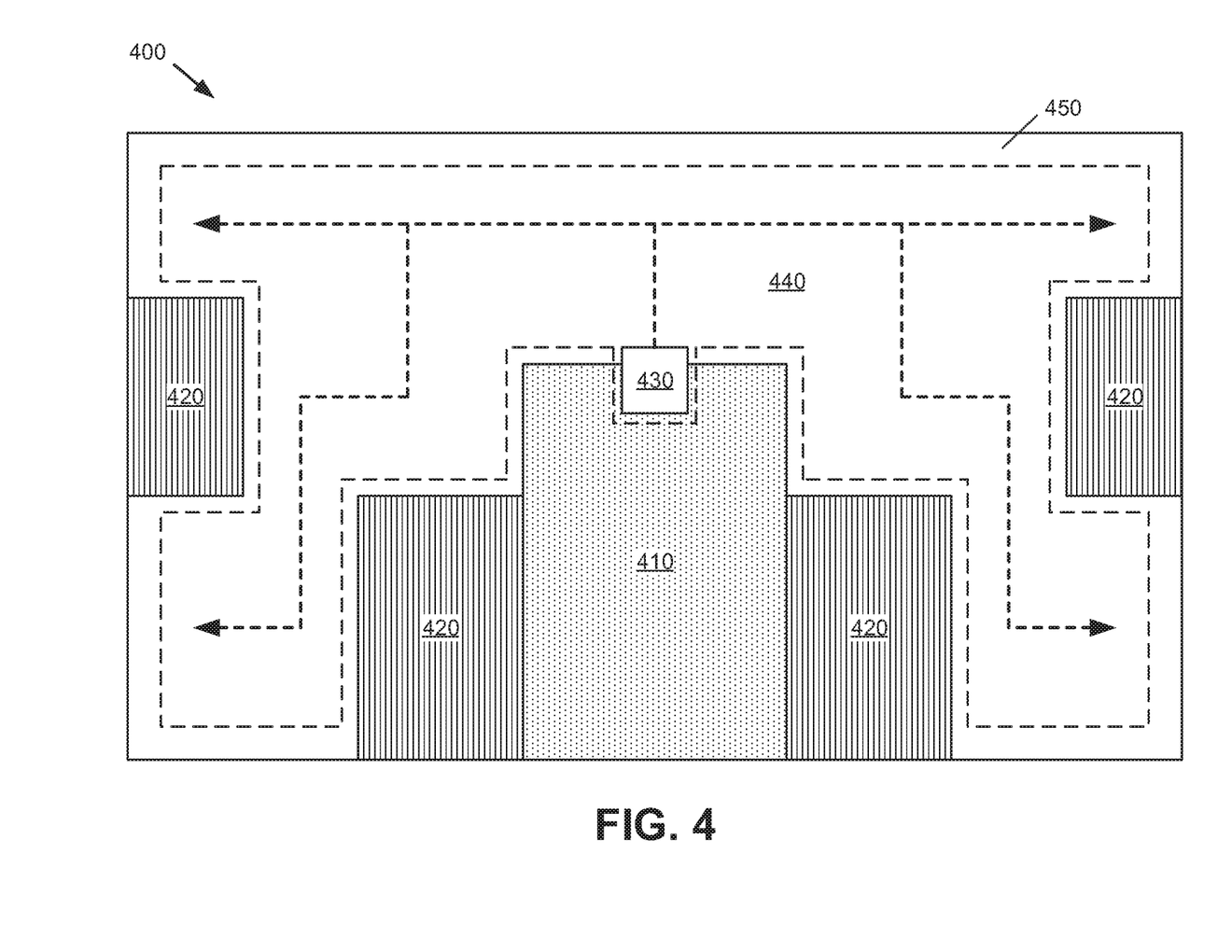
FIGS. 4-5 are top-down views depicting bump stop and cavity placements associated with respective semiconductor device structures in accordance with one or more embodiments of the disclosure.

Referring next to FIG. 4, a top-down view of another MEMS device 400 with fluid channeling structures as described herein is illustrated. Similar to the device 300 shown in FIG. 3, the device 400 includes a MEMS structure and a substrate, which can be arranged according to the cross-sectional view illustrated by FIG. 2. In one example, the substrate associated with the device 400 can be specific to the device and have a perimeter that corresponds to the perimeter of the device 400 and/or its corresponding MEMS structures. Alternatively, the substrate can extend through an area that is larger than the device, e.g., a semiconductor die, wafer, etc., such that the device 400 is associated with only a portion of the substrate. In either case, references in the following description to the "perimeter of the substrate" are intended to refer only to the perimeter of the portion of the substrate that is occupied by the device 400.

As shown in FIG. 4, the device 400 is associated with a MEMS structure, which can contain one or more non-moveable features 410 and one or more moveable features 420. The non-moveable features 410 can include, for example, an anchor and/or other support structure, which can be attached to a handle layer and/or otherwise used to support the device 400 during manufacturing. The moveable features 420 can include springs, switches, and/or any other appropriate feature(s) utilized by the device 400.

In a similar manner to the device 300 shown in FIG. 3, the substrate of the device 400 can be composed of a bump stop structure 450 that defines and/or is defined by a recess 440 situated within an interior of the device 400. As shown by FIG. 4, the features 410, 420 of the device 400 define a boundary region for the bump stop structure 450, such that the bump stop structure 450 traces the boundaries and/or contours of the boundary region. While FIG. 4 shows that the boundaries of the bump stop structure 450 are defined by both the non-moveable features 410 and the moveable features 420, it can be appreciated that the bump stop structure 450 could alternatively trace the contours or boundaries of less than all of the features 410, 420 or none of the features 410, 420. Further, while the features 410, 420 are illustrated as situated along the perimeter of the device 400, it can be further appreciated that one or more features 410, 420 could instead be positioned in the interior of the device 400. In such an implementation, one or more additional bump stop structures could be utilized to trace the boundaries or contours of the interior feature(s), effectively creating a bump stop "island" that can be connected to, or separate from, a perimeter bump stop structure such as the bump stop structure 450 shown in FIG. 4.

In an aspect, the device 400 further includes an opening 430 that provides ventilation for the device 400 during manufacturing. Here, the opening 430 is formed into space occupied by the non-moveable features 410 of the device 400. It should be appreciated, however, that the opening 430 could be formed into any portion of the device 400 that is suitable for facilitating the channeling of fluids through the device 400. As further shown in FIG. 4, the bump stop structure 450 is configured to border the opening 430 on three sides, and the opening 430 is adjacent to the recess 440 on the remaining side. Other positions and/or configurations could also be used.

Subsequent to the introduction of liquid into the device 400, e.g., for cleaning the device 400 during manufacturing, the opening 430 enables the passage of air into the device 400, thereby allowing the liquid introduced into the device 400 to evaporate. As the liquid evaporates, a meniscus forms and moves through the device as illustrated schematically by the dashed lines leading from the opening 430. In an aspect, the recess 440 defines a large reservoir through which a liquid and its associated meniscus can travel. As the meniscus is able to move more freely through wider areas, this can keep the meniscus radius of curvature large and thus reduce capillary pull-in force and stiction. Following cleaning and liquid evaporation, the opening 430 can optionally be sealed or otherwise closed.

In an aspect, the device 400 shown in FIG. 4 can include a MEMS structure that includes one or more MEMS features. The device 400 can additionally include a substrate that is situated parallel to the MEMS structure and positioned a first distance from the MEMS structure, e.g., the first distance 270 shown in FIG. 2. The bump stop structure 450 can then be formed on the substrate between the substrate and the MEMS structure and substantially trace an area of the substrate adjacent to respective MEMS features of the MEMS structure. The bump stop structure 450 can extend from the substrate to a second distance from the MEMS structure, e.g., the second distance 280 shown in FIG. 2, which is greater than zero and less than the first distance.

In another aspect, the device 400 shown in FIG. 4 can be manufactured by forming one or more recesses or cavities into the device substrate such that the recesses define the bump stop structure. In such a case, these recesses can be confined by an area of the substrate corresponding to an area in which one or more moveable MEMS features 420 are situated. In an aspect, the recesses can be formed with a width sufficient to facilitate the flow of fluids through the recesses with reduced surface tension.

Figure 5:
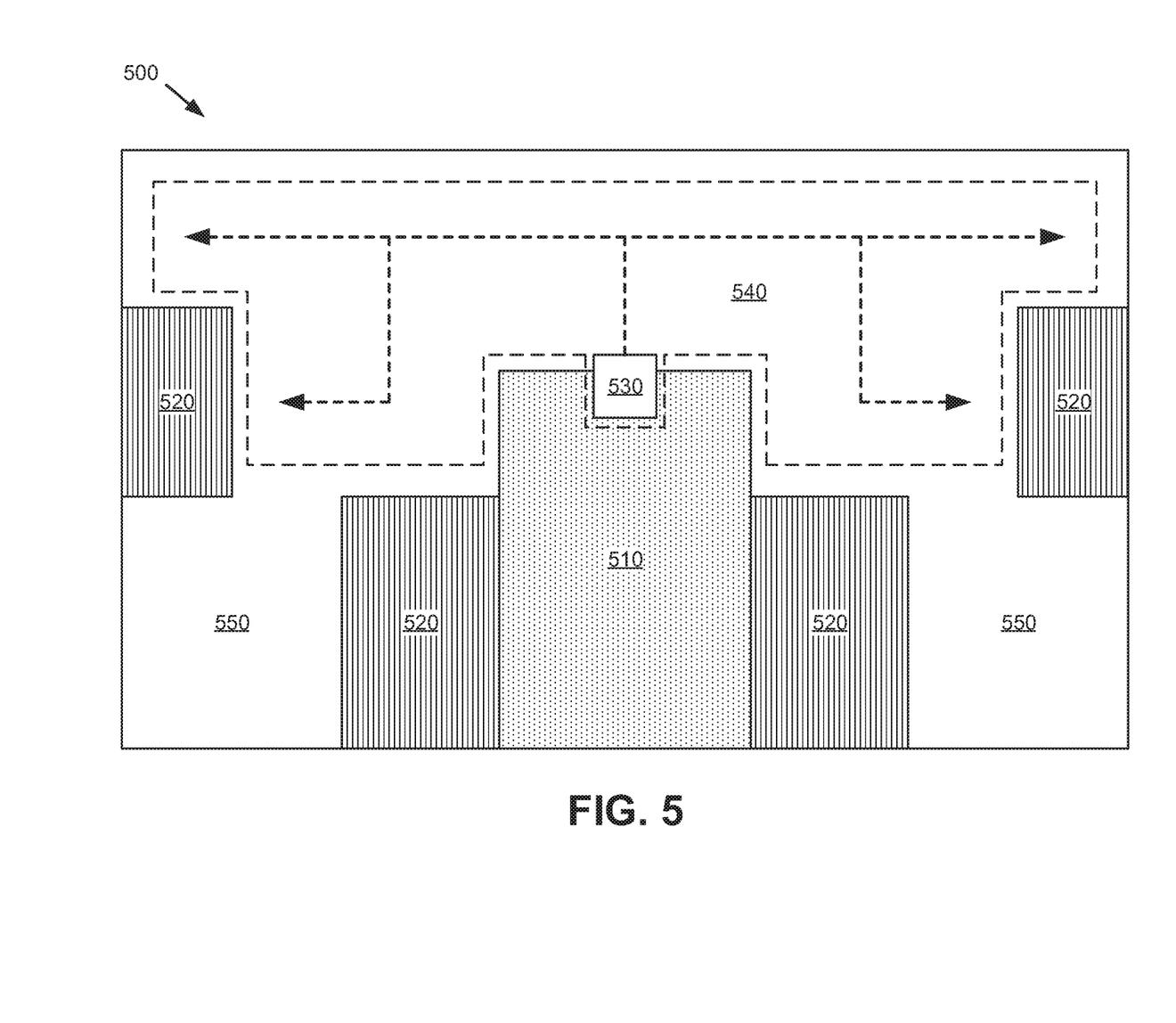

An alternative structure to that illustrated by FIG. 4 is shown with respect to device 500 in FIG. 5. As FIG. 5 illustrates, a bump stop structure 550 can additionally cover area(s) not occupied by any device features 510, 520. Despite this difference to the configuration of the bump stop structure 550, the opening 530 and associated liquid flow can occur in substantially the same manner as that described above with respect to device 400. In an aspect, the bump stop structure can be configured as shown by FIG. 5, for instance, in cases where it is desirable to minimize area associated with the recess 540.

Figure 6:
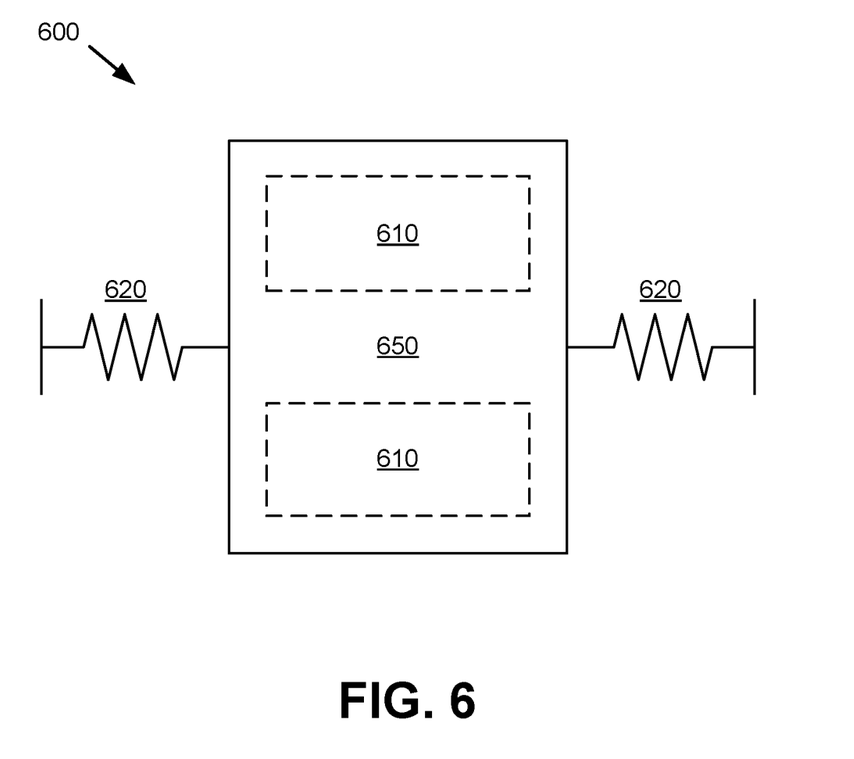
FIG. 6 is another simplified top-down view of a semiconductor device structure in accordance with one or more embodiments of the disclosure.

Turning next to FIG. 6, a MEMS structure 600 is illustrated that is supported by springs 620 and/or other supporting elements in a similar manner to device 300 shown in FIG. 3. As shown by FIG. 6, a bump stop 650 is situated along the perimeter of the structure 600. In addition, the bump stop structure 650 occupies area in the interior of the structure 600, thereby defining two distinct recesses 610 at opposite sides of the structure 600.

In an aspect, the bump stop 650 of the structure 600 is configured in the manner shown by FIG. 6 in order to decrease deflection of the structure 600 caused by surface tension in the fluid underneath. In particular, the bump stop 650 occupies an area along the perimeter of the structure 600, and further occupies an area in the interior of the structure 600 at which out-of-plane stiffness, e.g., linear displacement per unit point force, due to the springs 620 is higher than that observed at other portions of the structure 600. The recesses 610, in contrast, are disposed away from the springs 620 at areas in which the out-of-plane stiffness is less.

In an aspect, configuring the bump stop 650 as shown in FIG. 6 can also or alternatively be utilized based on the presence and/or position of moveable MEMS features (not shown in FIG. 6) in the structure 600. For instance, the substrate of the structure 600 can be effectively divided into a first area and a second area, where the first area includes the bump stop 650 and a first moveable portion of the structure 600, and the second area includes a second moveable portion of the structure 600. By configuring the bump stop 650 as described above, this configuration can be used in cases where the stiffness of the first moveable portion is higher than that of the second moveable portion.

With reference next to FIGS. 7-10, diagrams are provided that illustrate respective stages of a drying process that can be achieved using one or more of the structures described above. It should be appreciated that the process shown by FIGS. 7-10 is merely one example of a process that can be employed as described herein and that other processes are possible. It should further be appreciated that, where appropriate for purposes of explanation, the specific structures shown in FIGS. 7-10 have been modified between the respective drawings. In general, an optimal disposition of recesses and channels for a particular device can vary depending on the shape of the mechanical structure of the device and/or other constraints. Regardless of the specific structure utilized by a given device, the process shown in FIGS. 7-10 can be utilized for any structure shown in said drawings and/or any other suitable structure in accordance with the above description.

In an aspect, configuration of bump stops and cavities as described herein results in a device having one or more recesses connected to the outside ambient by one or more channels. At the outset of the drying phase, a meniscus forms on the outermost surface of the structure. As the volume of liquid trapped under the structure decreases (e.g., through evaporation), the meniscus is drawn through the channels, along a preconfigured path, to progressively empty the recesses without pulling the structure down. In doing so, capillary stiction and pull-in force associated with the drying process is reduced, thereby increasing the integrity of the structure through manufacturing. It is understood that the preconfigured path is defined by the dispositions of recesses and channels and the interaction of the meniscus with the recesses and channels according to the laws of physics, as specifically illustrated in FIGS. 7-10. In addition, by configuring recesses or cavities as described above, cavity pressure associated with an accelerometer or other MEMS device can be increased, which can result in a reduction to vibration sensitivity and/or other benefits.

Figure 7:
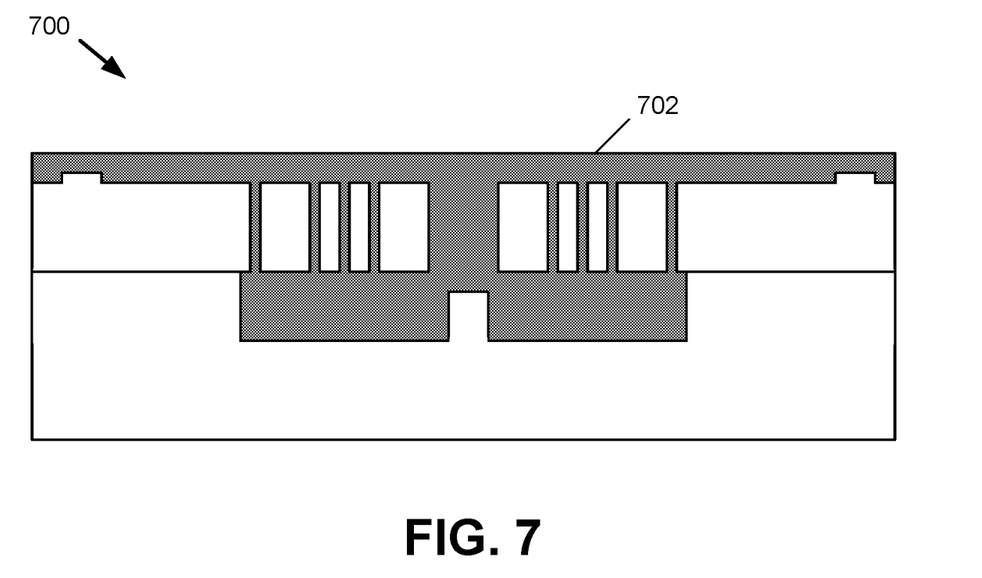
FIGS. 7-10 are diagrams depicting respective stages of a drying process for a semiconductor device in accordance with one or more embodiments of the disclosure.

With reference next to FIG. 7, an initial stage of the liquid evaporation process for a given MEMS device is shown by diagram 700. Here, the recesses and channels of the device are initially filled with a liquid 702, e.g., a liquid utilized in a cleaning process for the device. The liquid 702 can be any suitable fluid(s) desirably introduced to the device during manufacturing, such as water, alcohol, supercritical fluids such as pressurized carbon dioxide, etc.

Figure 8:
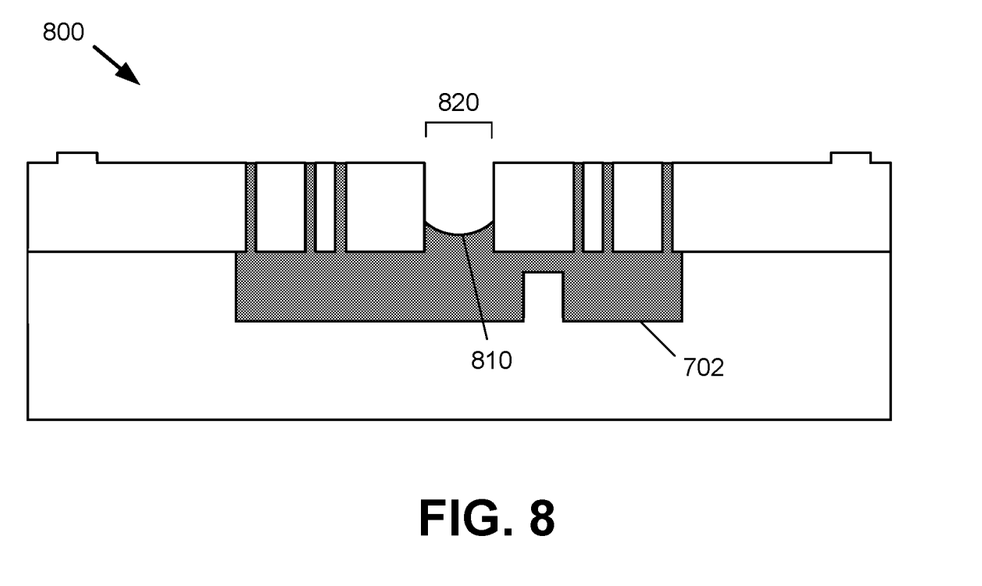

Next, as shown by diagram 800 in FIG. 8, the liquid 702 can begin to evaporate starting from the portion of the device in contact with the environment, here the top of the device. The gap 820 can correspond to, e.g., an opening 330, 430, 530 built into the device for entry of liquids and environmental air or other gases. As further shown in FIG. 8, the liquid forms a meniscus 810 as it evaporates through the opening 820.

In the state shown by FIG. 8, the pressure due to surface tension on the meniscus 810 can be given as $p_{la}=\gamma/r_{la}$, where $\gamma$ is the surface tension or surface energy (given as N/m or J/m$^2$) and ria is the radius of curvature of the liquid-air interface. Further, the radius of curvature $r_{la}$ can be derived from the equation $2r_{la} \cos \theta_c = d$, where $\theta_c$ is the angle of the meniscus to the device surface and d is the width of the opening 820. As the pressure in all of the liquid 702 is uniform, each meniscus present at a given device will have a consistent radius. Further, as the liquid 702 dries, it will attempt to cover as much surface area of the device as possible. This causes the larger opening 820 to empty before the smaller openings.

Figure 9:
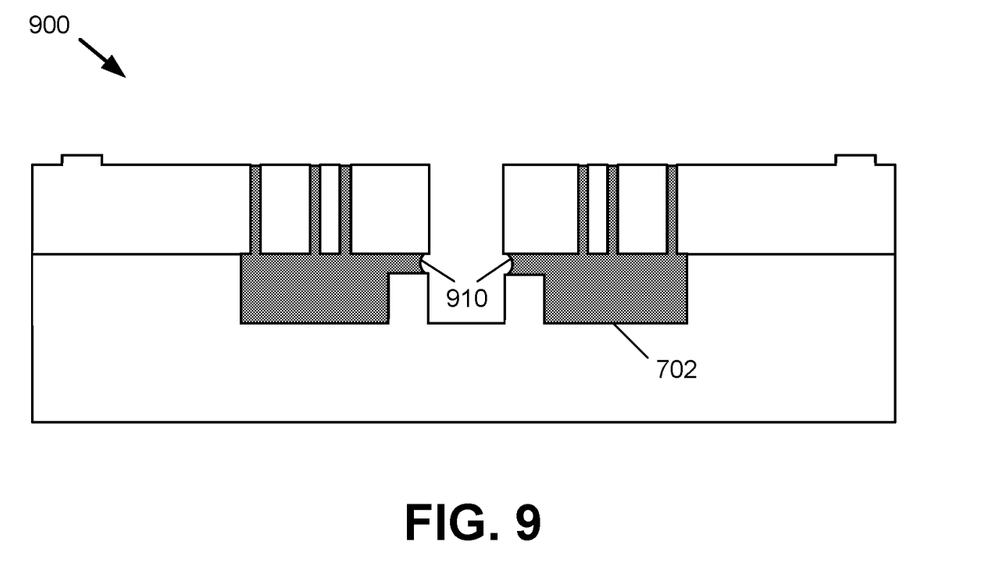

If the liquid is not properly channeled during evaporation, a state such as that shown by diagram 900 in FIG. 9 can occur. As FIG. 9 illustrates, the liquid 702 evaporates from the central cavity but does not escape the side cavities. As a result, a meniscus 910 is formed at bump stops on either side of the central cavity, situated at a distance from a moving structure that may be less than the width of the opening 820, such that the pressure drop in the liquid 702 due to surface tension is greater than in the case of FIG. 8. Further, the liquid 702 as shown in FIG. 9 contacts the entire bottom surface of the proof mass, which can result in the proof mass being pulled down onto the bump stops.

Figure 10:
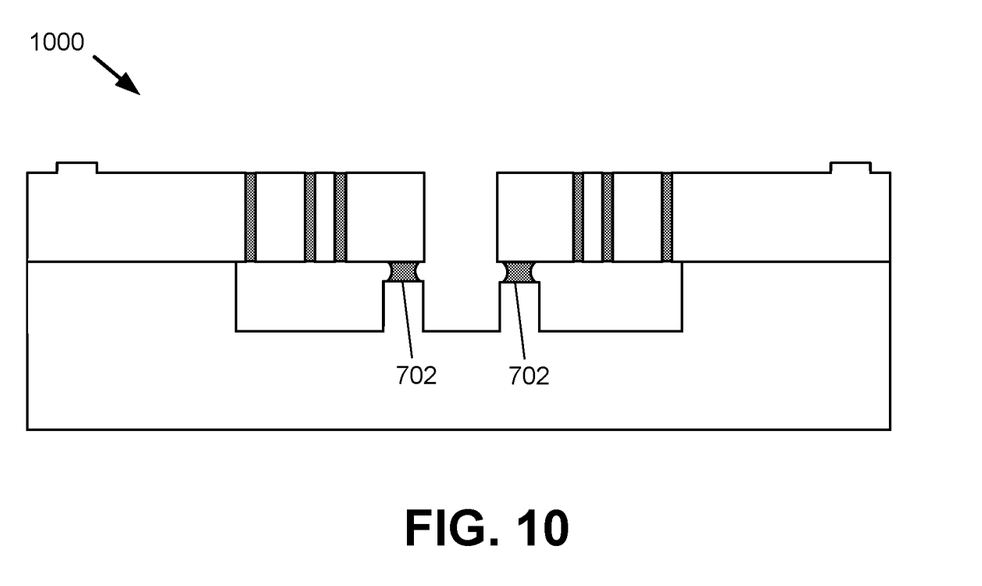

In contrast, diagram 1000 in FIG. 10 illustrates a state subsequent to that shown by FIG. 8 in which the liquid 702 is allowed to escape before the meniscus reaches the top of the bump stop structure. This can be achieved by drawing the liquid 702 through channels within the cavities of the device, which can be structured as shown by FIGS. 4-5 and/or by other appropriate means. As a result of the liquid escaping the cavities of the device, the liquid 702 can occupy less surface area and contact less of the bottom surface of the proof mass. This, in turn, can result in less capillary pull-in force.

Following the stage shown by diagram 1000, any remaining liquid 702, such as the liquid shown in the vertical channels and at the bump stops of the device, can later evaporate. Upon complete evaporation of the liquid 702, the device can be sealed and/or otherwise prepared for use.

In the present specification, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in this specification and annexed drawings should generally be construed to mean "one or more" unless specified otherwise or clear from context to be directed to a singular form.

In addition, the terms "example" and "such as" are utilized herein to mean serving as an instance or illustration. Any embodiment or design described herein as an "example" or referred to in connection with a "such as" clause is not necessarily to be construed as preferred or advantageous over other embodiments or designs. Rather, use of the terms "example" or "such as" is intended to present concepts in a concrete fashion. The terms "first," "second," "third," and so forth, as used in the claims and description, unless otherwise clear by context, is for clarity only and doesn't necessarily indicate or imply any order in time.

What has been described above includes examples of one or more embodiments of the disclosure. It is, of course, not possible to describe every conceivable combination of components or methodologies for purposes of describing these examples, and it can be recognized that many further combinations and permutations of the present embodiments are possible. Accordingly, the embodiments disclosed and/or claimed herein are intended to embrace all such alterations, modifications and variations that fall within the spirit and scope of the detailed description and the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A microelectromechanical system (MEMS) device, comprising:
    a MEMS structure comprising one or more non-moveable MEMS features;
    a substrate situated parallel to the MEMS structure and positioned a first distance from the MEMS structure; and
    a plurality of bump stop structures formed on the substrate between the substrate and the MEMS structure, wherein at least one of the plurality of bump stop structures extend from the substrate, and wherein at least a portion of the plurality of bump stop structures substantially trace a perimeter of the substrate, wherein an interior of the substrate comprises a first area and a second area, wherein the first area corresponds to the at least a portion of the plurality of bump stop structures and a first moveable portion of the MEMS device, wherein the second area corresponds to a second moveable portion of the MEMS device, and wherein a first stiffness of the first moveable portion in a direction normal to a plane of the substrate is higher than a second stiffness of the second moveable portion.

2. The MEMS device of claim 1, wherein the one or more non-moveable MEMS features are situated in an area along a perimeter of the MEMS structure, and wherein the at least a portion of the plurality of bump stop structures further substantially trace an area of the substrate aligned to the perimeter of the MEMS structure.

3. The MEMS device of claim 1, wherein the substrate and the at least a portion of the plurality of bump stop structures form a recess within the interior of the substrate having the first distance from the MEMS structure.

4. The MEMS device of claim 3, wherein the MEMS structure comprises a lateral opening situated within an area corresponding to the recess within the substrate.

5. The MEMS device of claim 4, wherein a width of the lateral opening and a length of the lateral opening are no less than the first distance.

6. The MEMS device of claim 4, wherein a width of the lateral opening and a length of the lateral opening are no less than a second distance.

7. A microelectromechanical system (MEMS) device, comprising:
    a MEMS structure comprising one or more non-moveable MEMS features situated in an area of the MEMS structure;
    a substrate situated parallel to the MEMS structure and positioned a first distance from the MEMS structure, wherein the first distance is greater than zero;
    a recess formed in the substrate, wherein the recess is confined by a boundary region disposed along a perimeter of the substrate and an area of the substrate corresponding to the area in which the non-moveable MEMS features are situated, wherein the recess extends into the substrate to a second distance from the MEMS structure, and wherein the second distance is greater than the first distance; and
    a plurality of bump stops disposed along the boundary region, wherein an interior of the substrate comprises a first area and a second area, wherein the first area corresponds to the at least a portion of the plurality of bump stops and a first moveable portion of the MEMS device, wherein the second area corresponds to a second moveable portion of the MEMS device, and wherein a first stiffness of the first moveable portion in a direction normal to a plane of the substrate is higher than a second stiffness of the second moveable portion.

8. The MEMS device of claim 7, wherein the MEMS structure comprises a lateral opening situated within an area corresponding to the recess within the substrate.

9. The MEMS device of claim 8, wherein a width of the lateral opening and a length of the lateral opening are no less than the first distance.

10. The MEMS device of claim 7, wherein a least one of the plurality of bump stops is placed to reduce a force drawing the MEMS structure toward the substrate during removal of a liquid disposed between the substrate and the MEMS structure.

11. The MEMS device of claim 10, wherein the force is caused by factors comprising a formation of a meniscus in the liquid during the removal of the liquid.

12. The MEMS device of claim 10, wherein the force comprises a force based on surface tension.

13. The MEMS device of claim 1, wherein a least one of the plurality of bump stop A structures is placed to reduce a force drawing the MEMS structure toward the substrate during removal of a liquid disposed between the substrate and the MEMS structure.

14. The MEMS device of claim 13, wherein the force is caused by factors comprising a formation of a meniscus in the liquid during the removal of the liquid.

15. The MEMS device of claim 13, wherein the force comprises a force based on surface tension.

\* \* \* \* \*